United States Patent [19]

Haberland et al.

[11] Patent Number: 4,707,067

[45] Date of Patent: Nov. 17, 1987

[54] OPTO-ELECTRONIC MODULE HOUSING

[75] Inventors: Detlef Haberland, Steinebach; Michael Langenwalter, Stockdorf; Klaus Panzer, Munich; Hans G. Rosen, Hohenschaeftlarn; Lothar Spaeter, Annweiler; Werner Spaeth, Holzkirchen; Bernd Seibert, Ottobrunn; Helmut Haltenorth, Munich, all of Fed. Rep. of Germany

[73] Assignee: Siemens Aktiengesellschaft, Berlin and Munich, Fed. Rep. of Germany

[21] Appl. No.: 704,332

[22] Filed: Feb. 22, 1985

[30] Foreign Application Priority Data

Feb. 22, 1984 [DE] Fed. Rep. of Germany ....... 3406424
Aug. 8, 1984 [DE] Fed. Rep. of Germany ....... 3429282

[51] Int. Cl.$^4$ ................................................ G02B 6/36
[52] U.S. Cl. ................................................ 350/96.20
[58] Field of Search ............... 350/96.15, 96.18, 96.20, 350/96.17; 357/74, 75; 250/239

[56] References Cited

U.S. PATENT DOCUMENTS

| 3,950,075 | 4/1976 | Cook et al. ........................ 350/96.20 |
| 4,291,942 | 9/1981 | Henry et al. ................... 350/96.2 X |

FOREIGN PATENT DOCUMENTS 0031146 7/1981 European Pat. Off. .
0094274 11/1983 European Pat. Off. .
2703887 8/1977 Fed. Rep. of Germany .
2831935 2/1980 Fed. Rep. of Germany .
3012118 10/1981 Fed. Rep. of Germany .
3409146 9/1985 Fed. Rep. of Germany .
2002136 1/1982 United Kingdom .

Primary Examiner—Eugene R. LaRoche
Assistant Examiner—Steven J. Mottola
Attorney, Agent, or Firm—Hill, Van Santen, Steadman & Simpson

[57] ABSTRACT

In an opto-electronic module housing for positioning an end of an optical fiber in a desired position relative to an active area of an opto-electronic component characterized by the housing including an optical fiber connector having an adjustment plane at one end and an arrangement for holding an end of an optical fiber with the axis of the fiber on an axis extending perpendicular to the adjustment plane with the end being a fixed distance from the plane, an adjustment frame being securable to the adjustment plane and an arrangement for locating an opto-electronic component or transducer relative to the frame including a plate having the component mounted thereon. The arrangement including the plate is securable to the frame and the frame and the arrangement enable adjusting the component in three spatial directions relative to the end of the fiber to obtain an optimum adjustable position. The module housing can be received in an outer gas and light-tight housing in which case the connector extends through a wall of a can or member forming part of the outer housing which coacts with a lid to enable access to the interiorly disposed module housing. The component can either be a light-emitting opto-electronic component or a light-opto-electronic receiving component.

17 Claims, 11 Drawing Figures

OPTO-ELECTRONIC MODULE HOUSING

BACKGROUND OF THE INVENTION

The present invention is directed to an improvement in a module housing for positioning an end of an optical fiber in a desired position relative to an active area of an opto-electronic component which may either be a light-emitting component or a light-receiving component.

Housings for positioning an optical fiber relative to an opto-electronic component have been described in U.S. Pat. No. 3,950,075 and also in U.S. Pat. No. 659,892, filed Oct. 11, 1984, which application claims priority from German application No. P 33 37 131.8. However, in many instances, the adjustability during assembly of the end of the fiber relative to the component in the housing is still inadequate and is not always exact.

SUMMARY OF THE INVENTION

The present invention is directed to providing an opto-electronic 200 megabit/second reception module and transmission module for an optical fiber telecommunications system. Over and above this, however, the invention is suitable per se for any opto-electronic module housing which receives light signals via an optical fiber or which transmits light signals via an optical fiber.

To accomplish these goals, the present invention is directed to an opto-electronic module housing for positioning an end of an optical fiber in a desired position relative to an active area of an opto-electronic transducer component, said housing including an optical fiber connector having an adjustment plane at one end and means for holding an end of the optical fiber with the axis of the fiber on an axis extending perpendicular to said adjustment plane with the end being a fixed distance from the plane; an adjustment frame being securable to the adjustment plane; and positioning means for locating an opto-electronic component relative to the frame including a plate having a component mounted thereon, said positioning means being securable to the frame, said frame and positioning means enabling adjusting the component in three spatial directions relative to the end of the fiber to obtain an optimum adjusted position.

The housing according to the present invention allows a facilitation of the mechanical-optical adjustment of the optical fiber axis to the component in an elegant fashion by means of measures which enable an extremely high precision, for example, precision far below 1 um in order to achieve the desired, maximum optical coupling between the optical fiber and the component. Damage to as well as contamination of the optical fiber end can thereby also be easily avoided during the positioning and during the fastening of both the plate relative to the adjustment frame as well as the adjustment frame to the adjustment plane.

A similar module housing is disclosed in European patent application E-A2-31 146; however, the assembly is relatively quite difficult. This is because the sensitive optical fiber end, which in the invention can be, for example, a tapered tip of a monomode fiber, can be too easily damaged and/or contaminated during assembly. For example, it can be contaminated with a resin.

Further embodiments of the present invention provide additional advantages. For example, the connector between the adjustment plane and the end of the fiber is composed of one or more stiff members which have a low coefficient of thermal expansion so that only a slight expansion will occur when heated. This allows the finally achieved adjustment to be made independent of the later disturbing influence on the basis of the corresponding stable structure and material selection. In particular, the adjustment is independent of either the thermal condition, which might cause shape changes or mechanical bending due to, for example, vibrations. Thus, the structure provides for the long-term stability to be improved even for operations under more difficult conditions.

Preferably, one of the three spatial dimensions or directions, which is preferably the first direction that is adjusted, largely coincides with the axis of the optical fiber which is held in the connector and with the optically most active direction of the component. This enables a precise adjustment of the component to be achieved, particularly easily and quickly, so that the optical coupling also becomes particularly intense, namely, a low-loss accompanied by means of exploiting the antenna-like optical emissions and respectively reception lobes of the optical fiber and of the component.

In one embodiment of the invention, the plate is provided with a hole with the component being secured on a surface of the plate facing away from the optical fiber with the active area overlying the hole. This provides the advantage of allowing the backside of the component which faces the plate to be utilized for the optical coupling and to increase the protection of the component against damage during adjustment.

In another embodiment, the positioning means, besides including the plate, includes a slidable member which is either indirectly or directly rigidly connected to the plate and which is movable in the first dimension or axial direction of the fiber in the adjustment frame. This provides the advantage that the plates or components can be arbitrarily shaped in order, for example, to be able to employ small plates as well as to be able to apply the component separately to its own plate in order, for example, that the component need not be applied in the immediate proximity of the potential of the inside surface of the modular housing as seen in terms of radio-frequency technology. In addition, when the component is connected to a backside or side of the plate facing away from the optical fiber as mentioned hereinabove, the plate will be inserted into the adjustment frame which will act with the sliding member to provide a radio-frequency shielding of the component by means of appropriate grounding and, as needed, metallization of the plate, frame and slidable member.

In each of the above-mentioned embodiments, it is desirable to provide at least one lens including thereamong at least one collecting lens such as a spherical lens or a cylindrical lens which is attached or positioned between the end of the optical fiber and the optimum adjusted position for the component. The provision of the lens allows an especially intense optical coupling to be made which provides a particularly low loss.

In another embodiment of the invention, the positioning means includes only the plate which is directly secured to the frame after an optimum adjusted position has been attained. It is noted that whether the positioning means is a single plate or includes a plate mounted by a slidable member to the frame, it is particularly desirable to secure the slidable member or plate to the adjustable frame as well as secure the adjustable frame on the adjustment plane by means of laser welding. This provides the advantage that a stable fastening can be achieved in a manner other than by gluing.

In each of the above-mentioned embodiments, at least one amplifying element can be attached to a surface of the plate close to the component and be electrically connected thereto. This provides the advantage of low line lengths, which are very favorable when operating in a radio-frequency range.

In each of the embodiments, the plate may contain or form a grounded metallic surface and carry at least one amplifying component on one of its surfaces which faces away from the surface carrying the component. The amplifying component is then indirectly or directly connected to the component d via at least one insulated line, for example, through a lead that passes through the plate. This provides an advantage that feed-back between the amplifier component and the amplifier element, for example, between the amplifier and a booster amplifier, can be avoided by means of skilled shielding.

Other advantages and embodiments will be apparent from the drawings and claims.

DESCRIPTION OF THE PREFERRED EMBODIMENTS

Figure 2:
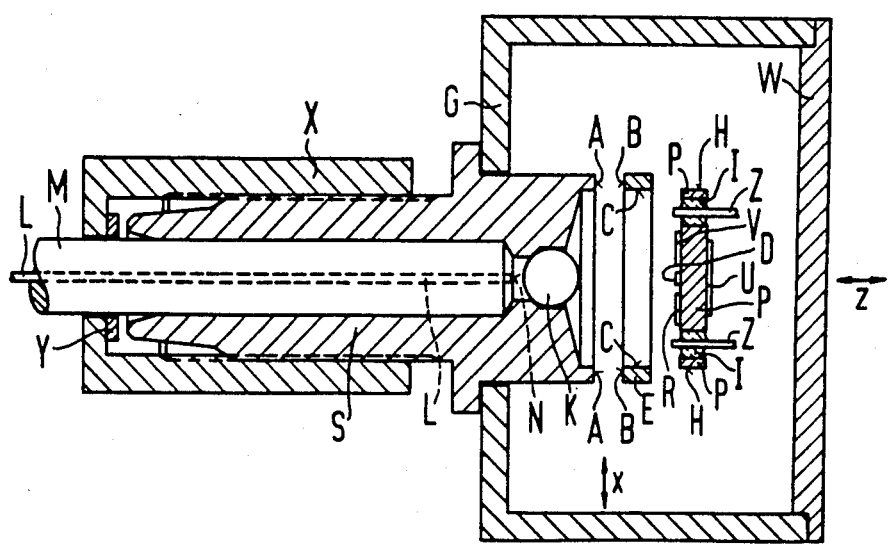
FIG. 2 is a cross-sectional view with portions in elevation for purposes of illustration and parts in a disassembled arrangement of an opto-electronic module housing in accordance with the present invention.

The principles of the present invention are particularly useful in an opto-electronic module housing illustrated in FIG. 2. As illustrated in FIG. 2, an outer gastight housing, which is formed of a tank or can G as well as a replaceable and removable cover W which preferably forms a light-tight and gas-tight seal with the can G, is illustrated. In this housing, the inside of the can is easily accessible for mounting, for making final adjustments and for making final inspections.

An optical fiber connector S, which has a plug shape, receives an optical fiber plug pin M which can be tightly held in the connector S by means of a threaded nut or sleeve X which is threaded on the outer surface of the connector S and engages a detent or shoulder Y on the plug pin M. As illustrated, the plug pin M concentrically holds an optical fiber waveguide L with an end N adjacent the end of the plug pin M.

If the module housing is a receptive module housing, then the optical fiber connector S serves for supplying the light modulated with information that is being carried on the waveguide or optical fiber L through the housing wall G. However, if it is a transmission module housing, then light created in the housing is connected to the waveguide L and carried out through the wall by the connector S. The opto-electronic component D which receives light can be, for example, a GaAs-PIN photodiode which converts light signals into electrical signals. However, if the component D transmits light it may be a laser diode which convert electrical signals into light signals. In either case, it is positioned to be on the axis of the light waveguide L.

In the illustrated embodiment, the actual module housing is formed by the connector S, an adjustment frame E and a plate P. The outer housing is formed by the connector S, the can or tank G and the cover W. In principle, the outer housing which is primarily the can G and cover W can also additionally contain other elements, for example, an additional preamplifier or booster amplifier.

Figure 1:
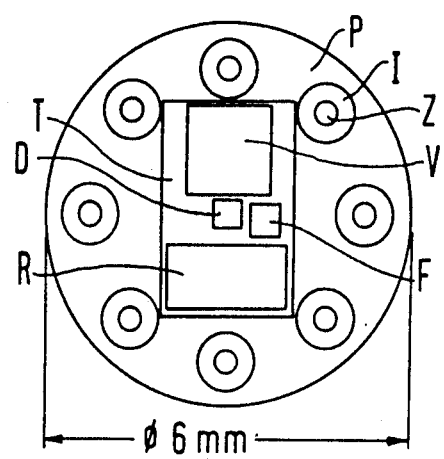
FIG. 1 is a plan view of an embodiment of the plate of the present invention with component and amplifier elements thereon.

The plate P, which is shown in cross-sectional view in FIG. 2, corresponds to a plate shown in plan view in FIG. 1 and is at least partially pushed to extend inside of the frame E after the adjustment so that at least a part of the peripheral surface H of the plate P is in contact with an inner peripheral surface C of the frame E. In this regard, it is noted that FIG. 2 shows the plate P prior to being adjusted relative to the frame E and the frame E being adjusted relative to the connector S. The frame E has an adjustment surface B, which also contacts adjustment plane A of the connector S.

As illustrated, the plate P is first freely displaceable even beyond the optimum adjusted position in a first direction which is a direction z that is parallel to and on the axis of the optical fiber L. Since the adjustment frame E is at first freely movable relative to the adjustment plane A in the two lateral directions even beyond the optimum adjusted position, the component D secured to the plate P can be adjusted in all three dimensions or directions with the desired precision relative to the position of the end N of the optical fiber L. It is noted that the adjustment plane A is substantially perpendicular to the axis of the fiber L as it is held in the connector S.

To perform the adjustments, the adjustment frame E is placed with its surface B in contact with the adjustment plane A. Then the plate P is inserted into the frame E with the peripheral surface H, which is illustrated as being cylindrical in contact with the inner cylindrical surface C. An adjustment in the direction z, which is along the axis of the fiber L relative to the end N can be accomplished. Then, the frame E can be positioned in the two lateral directions x and y wherein the direction x is illustrated in FIG. 2 and the direction y is perpendicular to the plane of the paper and to the direction x. It is noted that after making the adjustment in direction z and the two lateral directions, a repeat can be made of the adjustments to obtain an ideal adjustment. After the adjustments are completed, the palte can be secured in the frame E and the frame is secured to the adjustment plane A to form a rigid, final and permanent securing of the component relative to the end N of the fiber L. The connector S can also be rigidly secured in the wall of the can G. It is noted that the securing of the plate P in the adjustment frame E is preferably at the surfaces H/C and the component D is then rigidly securable in its optimum adjusted position respectively by means, for example, of clamping, gluing, welding and/or soldering. The adjustments as well as these final rigid fastenings to the adjustment plane A and thus to the tank G in this example are preferably incurred through uninterrupted observation or respective measurement of the optical coupling between the end N of the optical fiber L and the component D during a corresponding optoelectronic initialization of the component D and of the optical fiber L. A maximum, thus optimum, optical coupling between the component D and the optical fiber L is therewith permanently achieved in the module housing S/E/P by means of preferably repeating the searching for the optical adjustment position and fastening of this adjusted position.

Instead of the shown optical fiber plug S comprising a plug pin M, an optical fiber connector S containing an optical fiber L can be applied rigidly and irreleasably to the module housing S/E/P and thus to the adjustment plane A instead of in a releasable means by the nut X engaging the shoulder Y. While avoiding the tolerance condition by releasability, it is also possible with a rigid and irreleasable fastening of the optical fiber close to its end N to the module housing or respectively to the members comprising the adjustment frame E to achieve an especially precise, durable and stable adjustment of the end N of the optical fiber relative to the component D.

The adjustment frame E shown in FIG. 2 is in fact essentially a cylindrical ring in which a round plate P illustrated in FIG. 1 is slipped. However, both the plate P as well as the adjustment frame E can also have other shapes which are matched to one another. For example, a square plate instead of a round plate P and, for example, a square inside opening C in the adjustment frame E.

The long-term stability of the position of the end N of the optical fiber L relative to the adjustment plane A can be achieved or respectively promoted by means of a corresponding stable structure and material selection for all members. Thus, by selecting a material, which has a low coefficient of thermal expansion, particularly for all members extending between the end N of the optical fiber L and the adjustment plane A, the adjustment will not be disturbed by any thermal expansion.

In the embodiment of FIG. 2, the first dimension in which the plate P can be moved in the adjustment frame E for the adjustment of the component D should preferably at least largely coincide with the direction of the axis of the optical fiber L and with the optical-most active direction of the component D. That facilitates the optimization of the optical coupling, namely, the subsequent, final adjustment of the plate P, particularly when the adjustment frame E is displaceable in the other two directions is at least already approximately adjusted, i.e., has been brought into optimum adjusted position, for example, is already finally contacting adjustment plane A in the outer housing G/W. This at least largely final movement and ultimate fastening of the plate P in the adjustment frame E, can then occur relatively late due to the alignment or far-reaching alignment of the optical fiber axis L to the component D, namely, even when the optical coupling between the component fastened to the plate P and the optical fiber L has already been preliminarily optimized by means of moving and fastening the adjustable frame E to the adjustment plane A without a prior, final fastening of the plate P. Such a sequence of ultimate/final fastenings of the parts E and P to the adjustment plane A is especially beneficial when, as is often the standard practice given monomode optical fibers, the tolerance to be ultimately observed for the position of the component D perpendicular to the direction of the optical fiber axis are, for example, ten times stricter and amount to $\pm 0.05$ um whereas in the direction of the optical axis, the tolerance is $\pm 0.5$ $\mu$m.

In the embodiment of FIG. 2, a lens system K is positioned between the optical fiber connector S and the component D and the lens system K contains at least a single lens including at least one collecting lens, for example, an especially simple manufacturable spherical lens K or an especially simple manufacturable glass cylindrical lens K. These lenses help to optically couple the optically-most active location of the component D to the end N of the optical fiber L. Collecting lenses in a spherical or a semi-cylindrical shape at the end of an optical fiber for bundling the light and thus for improving of the optical coupling at the optical fiber connectors are known per se and are, for example, disclosed in the U.S. Letters Patent No. 3,950,075, German OS No. 30 12 118, British Pat. No. 2,002,136, German OS No. 28 31 935 and German OS No. 27 03 887.

It has been shown that often a single lens, i.e., a collecting lens, but at least a multi-lens optical system between the component D and the end N of the optical fiber L already enables a particular advantage for the invention. This is due to an antenna-like characteristic of the optical properties of the component D on the one hand frequently having a relatively broad, spread lobe, i.e., a broad light-emission lobe or light-reception lobe. The end N of the optical fiber on the other hand frequently has an antenna-like characteristic with a very narrow, tightly directed lobe. The different lobe shapes of these two parts, the end N and the component D, in addition to the different absolute sizes of the optical-active surface of these two parts can be matched to one another with the assistance of these lenses which may be additionally upgraded at their surfaces but can also already be adequately matched to one another with the assistance of a spherical lens K. Thus, it can be obtained that the coupling between the component D and the end N of the optical fiber L become a low-loss, low-reflecting as well, frequently even given a particularly greater tolerance for the optically adjustable position so that even the tolerance for allowable deviations of the spatial position of the two parts N/D from the most ideal adjustable position becomes great.

When, namely, the component D is a light-receiving element, for example, a GaAs-PIN diode D, then an imprecise insertion of the optical fiber plug M which is changed from time-to-time, often has only a slight disturbing effect because all of the light beamed out of the end N of the optical fiber L as a consequence of the narrow lobe is received by means of the lens which is secured in the housing and thus focuses the light on the broad lobe of the optically most active location of the diode D which lies in the light focus. The distance between the end N of the optical fiber and the rigidly adjusted lenses or lens K can thereby often pleasantly comprise an extremely great tolerance for an optical system particularly when the diameter of the lens system K, particularly a spherical lens K as the sole lens, is extremely large in comparison to the diameter of the fiber. This fundamentally applies both to monomode fibers as well as multimode fibers.

When, by contrast, the component D emits light, and is, for example, a broad-lobed laser diode, then, given a suitable selection of the refractive index for the lens K, the single lens or the lenses, can be secured so immediately adjacent the component D that the total radiation of the component D despite its broad lobe impinges only on a small section of the adjacent lens surface of the adjacent lens and in turn departs the last lens surface of this lens system as a largely parallel focused thin ray. In this fashion, accordingly, the broad lobe of this transmitting component D is often already sufficiently largely adapted by means of the spherical lens K to the narrow lobe of the end N of the optical fiber L in order to reduce reflections and imaging imprecisions. The tolerance for the distance between the end N of the optical fiber L and the lens surface of the lens system K adjacent the end N can also thereby be pleasantly made of nearly an arbitrary size particularly by means of a suitable selection of the lenses and also have tolerances extremely great for an optical system.

As illustrated in FIGS. 1 and 2, additional elements can also be attached to the plate P. Thus, close to the component P, the plate P can support at least one amplifier element V, for example, a preamplifier. In order to ideally handle frequencies in the radio-frequency range, the element V is conductively connected to the component D by means of optimally short, low-capacitance or respectively, low-inductance bond wires which are not shown in the Figures for the sake of clarity. As illustrated, the component D as well as the amplifier V are on a chip T in accordance with the teachings of German OS No. 34 09 146.

In addition, additional components which operate with the frequencies in the radio-frequency range, for example, a GaAs-FET element F for matching the voltage level of the diode D to the voltage or current level of the amplifier V can be inserted between the component D which, for example, may be the light-receiving GaAs-PIN diode D, and the preamplifier V. Again, the corresponding electrical lines have been omitted for the sake of clarity in the drawings. Moreover, even other elements can be attached, for example, a dropping resistor R for the component D, for example, as a printed thick-film resistor R as well as particularly when T is a corresponding ceramic carrier unit. All such elements R, F, V, even together with the component D, can have been mounted, tested, connected and adjusted radio-frequency-wise as needed on the carrier T, preferably step-by-step, whether before the carrier T has been mounted on the plate P or after it has been mounted on the plate P. Thus, before the carrier T is finally secured on the plate P or before the plate P is finally secured in the housing S/E/P, failure of the component or one of the other elements can be determined and thus the reject rate in the manufacture of the module housing S/E/P can be kept extremely low.

As illustrated, the component D is preferably fastened in the middle of the plate P and correspondingly has been placed in the middle of the carrier unit T because often largely balanced structures can considerably facilitate the final adjustment of the adjustment frame E to the adjustment plane A later on. Thus, the final adjustment of the component D relative to the end N of the optical fiber L is easily facilitate.

The plate P itself can in and of itself also be an inexpensive, standardized part, for example, such as illustrated in FIG. 1 which is roughly a 6 mm diameter ordinary pin base of a standard housing with bushings or pins Z fused in glass insulators I so that external electrical connections of the various elements D, V, F and R including the power supply and grounding can also be conducted via these pins Z fused in the insulators I to the back side of the plate P. These connections of the elements thus remain easily accessible for final testing and for final wiring to external circuit parts. This is true even after the final adjustment and rigid fastening of the plate P to the adjustment planes. For example, by lifting off the housing cover W. Even in the tightest, smallest module housing S/E/P, even numerous elements such as D, V, F and R are introducible economically in the smallest space, are well-adjusted and are protected after rigid fastening to the adjustment plane A so that they remain electrically accessible via the bushings or pins Z.

Moreover, nearly the entire module housing S/E/P, namely, the plate P, the adjustment frame E and the connector S together with the adjustment plane A which may potentially be attached to a separate member that is directly or indirectly connected to the optical fiber connector S, can be formed of grounded metal masses that are electrically or conductively connected to one another. A very good radio-frequency shielding of all parts or, respectively, elements attached in this module housing S/E/P, which are essentially disrupted by radio-frequency and stray capacitances, is thus attainable. For the protection of the connections/bushings Z, also in order to potentially attach even further elements on the outside close to the connections Z, other external or outer housings, for example, having parts G/W, can be attached around the whole arrangement. As a result of a good thermal conductivity of such metal masses, the plate P and thus the component D is then in addition relatively easily cooled particularly when the optical fiber connector S and/or the housing G/W also comprises well-cooled cooling ribs on an outside surface. A component D, which emits large amounts of dissipated heat, particularly a light-emitting component D such as, for example, a laser diode D, can thus also be well cooled from the outside. In the invention and in the developments thereof as well, cooling measures, which are known per se, can also be applied including the measures for cooling housings which are disclosed in German OS No. 34 29 234, German OS No. 34 29 281 and German OS No. 34 29 269.

At least one more amplifier component U, which is electrically connected high-frequency-wise via at least one insulated line, for example, via bushing or pin Z of the plate P to a component D or to at least one amplifier element V/F, can also accordingly be attached to the plate P. The plate P is grounded and is either metallic or has a metallized layer on which a severe space shortage often prevails. Thus, the component U is attached namely, for reasons of stray capacitances as well—to a back surface of the plate P, which surface faces away from the surface in which the component D is mounted. The amplifier element U can then be a preamplifier U when the component emits light. The amplifier component U can be a booster amplifier U when the component D receives the light. Thus, disturbing radio-frequency feedbacks between these amplifier components U and elements D, V, R and F on the other plate side can thus also be suppressed or respectively attenuated. When the outer housing G/W is likewise metallic or has been metallized and grounded, these amplifier components U are also shielded toward the outside.

Figure 3:
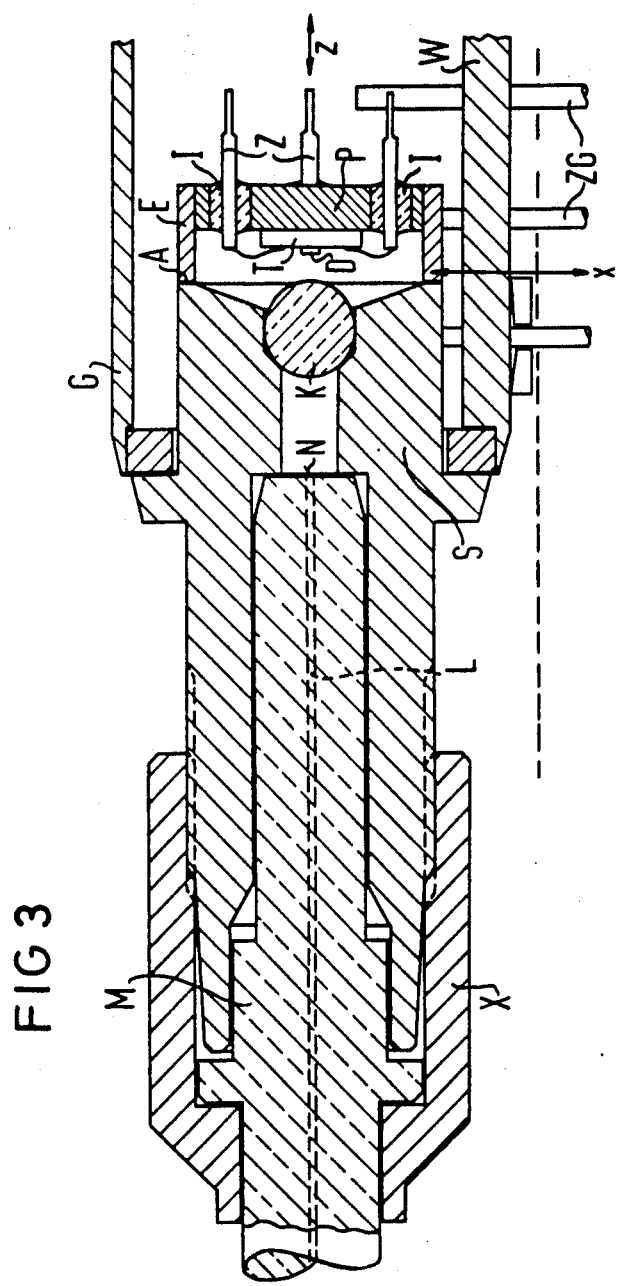
FIG. 3 is a cross-sectional view similar to FIG. 2 of an embodiment of the modular housing in accordance with the present invention, which embodiment can be plugged and soldered into a printed circuit board due to lead pins extending from the outer housing.

External electrical connections can also be attached to the outer housing G/W. An embodiment of the invention is illustrated in FIG. 3 and has an outer housing G/W comprising a cover W adjacent the bottom of the outer housing with through pins ZG. These through pins ZG serve on the one hand to conduct individual potentials to the bushings or pins Z via wires which are not shown in FIG. 3 for the sake of clarity and to conduct individual potentials away from the bushings toward the outside. In addition, the outer housing G/W can then be plugged flush into holes of a printed circuit board by means of its through pins ZG which may be soldered in the holes.

A whole series of measures already mentioned are suitable for the final fastening of the plate P to the adjustment frame E and of the adjustment frame E to the adjustment plane A.

Gluing with a hardenable adhesive is often particularly beneficial. The risk that the adjustment will subsequently deteriorate due to after-effects of the gluing is generally slight, at least when an adhesive is employed that is no longer destroyed during the rated useful life due to aging and due to operating heat.

Soldering is also suitable per se for fastening. However, as a consequence of sloppy soldering, the adjustment can sometimes be too greatly destroyed because of the heating when the soldering first expands the module housing or at least the adjustment frame E, too much so that the adjustment may potentially be too greatly modified after cooling. The solder compounds sometimes also tend to too quickly recrystallize which are not sufficiently stable for extreme high demands of the precision with respect to the strength but also sometimes with respect to the adjustment.

Point welding, especially laser spot-welding, can also be used for fastening either alone or together with, for example, gluing. The least possible warping should thereby occur. Only relatively low-energy light flashes, which are created by a high speed beam, should therefore be employed and these, if possible, only insofar as they are absolutely necessary for fastening. Too many melt-downs, namely, often increase the risk that the adjustment will be more or less destroyed later. Yet, the shielding effect is sometimes too low on the basis of gluing as already shown in FIGS. 2 and 3.

Figure 4:
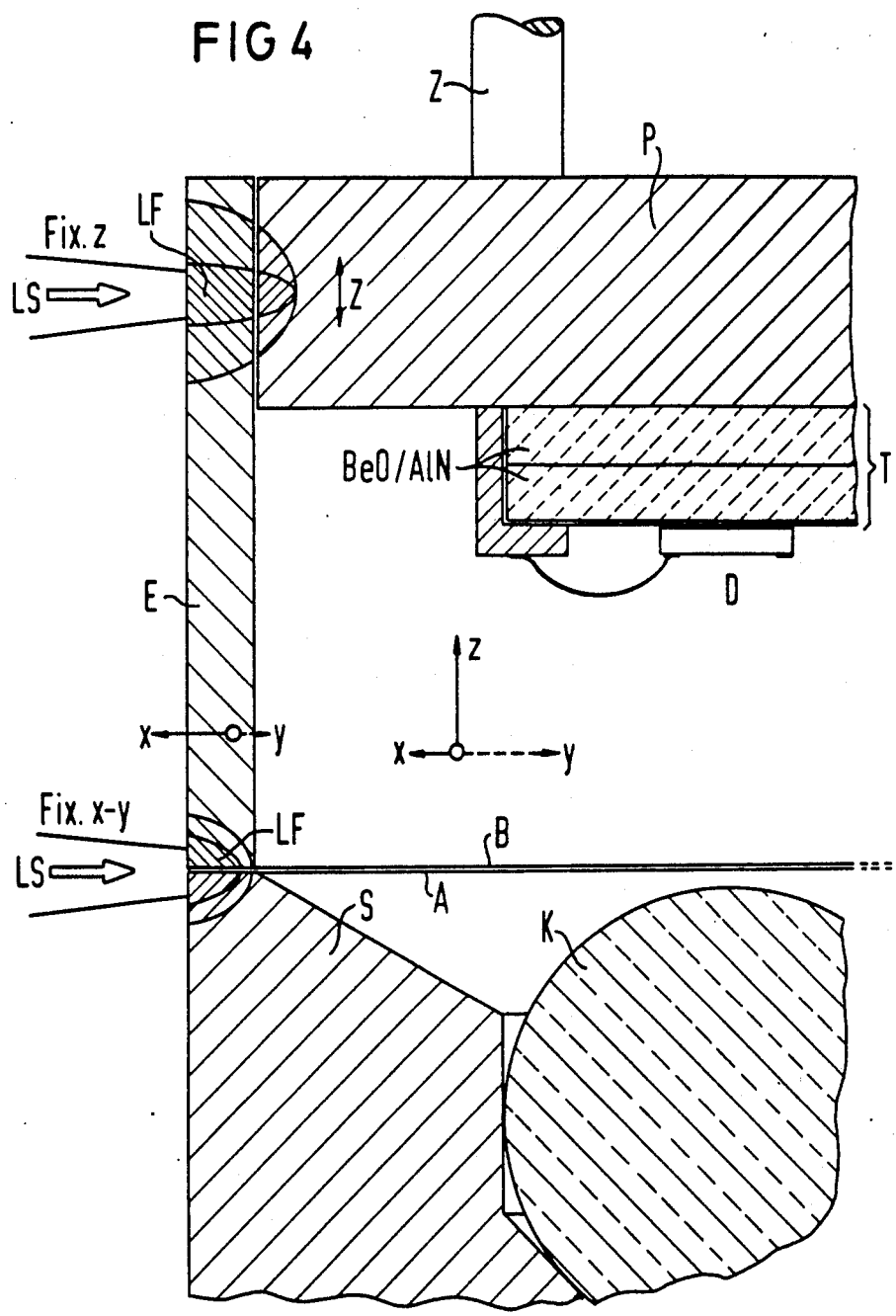
FIG. 4 is an enlarged cross-sectional view of a portion of the embodiment of FIG. 3 illustrating the positions of the welds joining the parts together.
Figure 5:
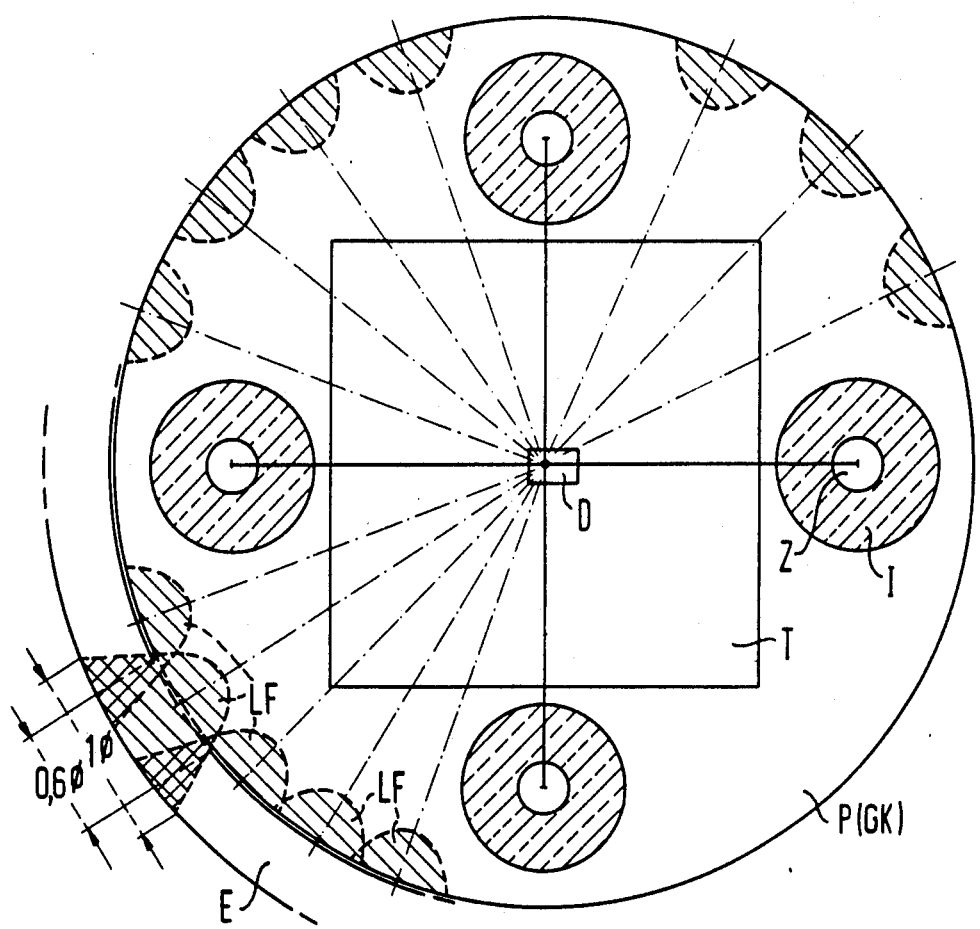
FIG. 5 is a partial plan view of a plate element in accordance with the present invention and illustrates annular positions of the multiple point welds for fastening the plate in the frame.
Figure 6:
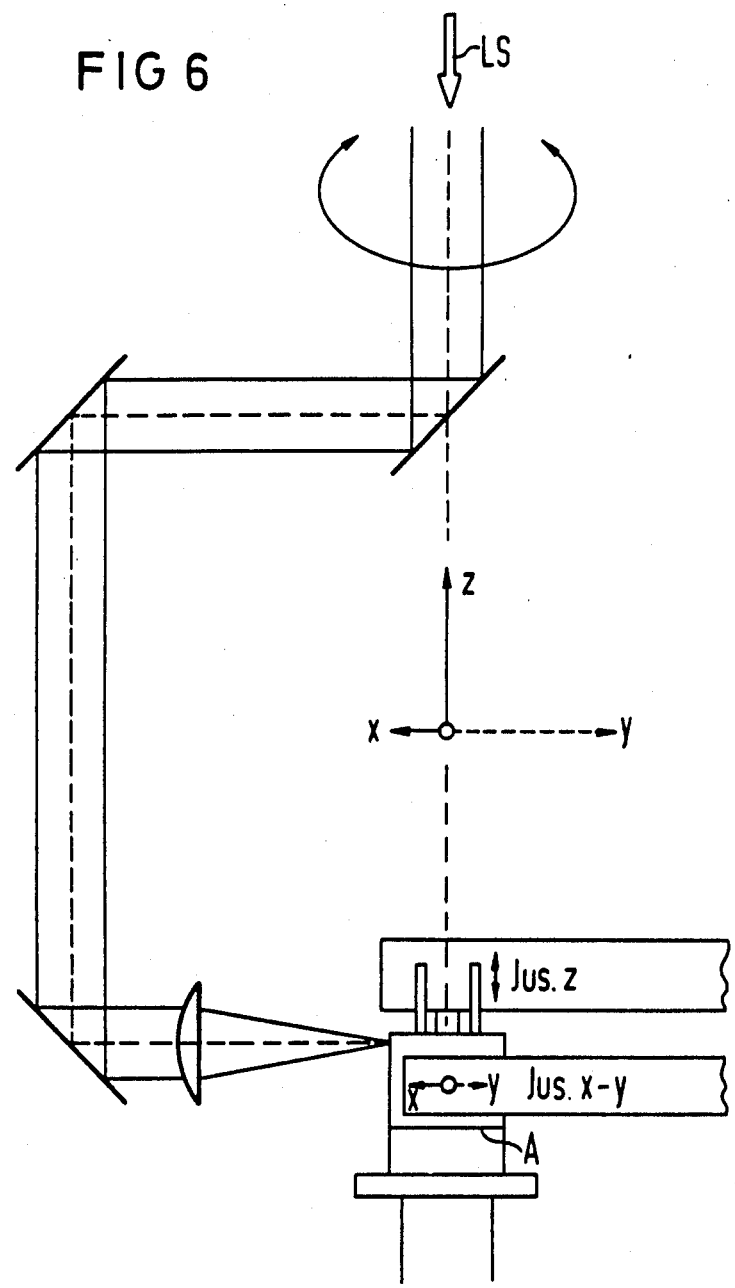
FIG. 6 is a schematic presentation of an arrangement for positioning the parts and for spot-welding them such as with a laser beam.

As illustrated in FIGS. 4, 5 and 6, fastenings or connections LF can be produced by means of the laser light LS with spot-welding after the final adjustment of the plate P in the z dimension or direction and of the adjustment frame E in the x and y directions or dimensions. The parts P/E/S thus connected to one another in a case where these parts are conductive themselves, are then also reliably electrically connected to one another via the fastenings or the spot-welds LF. Thus, the shielding effect against radio-frequency disturbances is approved or respectively assured. The good shielding effect is also frequently required relative to the environment outside of the inner module housing S/E/P. For example, the input connection of the amplifier component U and/or of the amplifier element V in FIG. 2 would represent a good reception antenna and/or transmission antenna for noise pulses from the environment and/or into the environment whereby the amplifiers U and V moreover generally operate purely digitally with extremely steep current pulse edges, for example, pulse repetition frequencies of several hundred megabits/second. The spot-welding or respectively laser-welding can therefore eliminate an additional outlay for shielding plates between the individual amplifier stages U and V inside of the module housing. Specifically, when the component D is not a reception photodiode D but a light-emitting diode D, for example, an IRED diode, the quantities of dissipated heat which are then often particularly high can be sufficiently dissipated toward the outside to the external cooling agent via such weld fastenings LF, for example, 200 mW dissipated heat by means of a sufficiently low thermal resistance between the component D and the surface of the module housing S/E/P or, respectively, of the housing S/G/W. The life expectancy, particularly of the IRED light-emitting diode D, is all the shorter the higher the barrier layer temperature during operation so that a good cooling obtainable by spot-welding also extends the life expectancy of this type of diode.

The welding, particularly spot-welding, by means of a laser can be executed non-contacting, for example, by means of a rotating laser deflector and by means of a piezo-electrically operated micromanipulator which precisely adjusts to, for example, 0.05 $\mu$m and comprises the gripper arm Jus.z for adjusting the plate P and the gripper arm Jus.x-y for adjusting the frame E as illustrated in FIG. 6. The multiple adjustments, for example, of the parts P/E/S to be welded which are still at first moistened with the liquid adhesive can thereby be executed first and the subsequent, adequately carefully non-contacting welding with the laser LS usually influences the adjustment to an adequately slight degree particularly when there is an adequate cooling during welding.

The number of spot welds distributed around the circumference can be arbitrarily selected per se. It may be seen from FIG. 5 that 12, 16 or 20 spot welds LF, each with a 0.6 mm diameter, can also be selected to be between the plate P and the adjustment frame E. A certain optimum heat dissipation is achieved when the spot welds LF mutually overlap which will occur with approximately 20 spot welds. However, far fewer spot welds LF are often sufficient. The thermal resistance at the welded gap/junction P/E is all the lower the higher the number of spot welds LF. The welds, particularly spot weld points LF, are thereby preferably applied between the glass insulators I of the pins or bushings Z as illustrated in FIG. 5. No welds LF are thus executed in the proximity of the glass insulators I in order to preserve the glass insulators. In addition, these insulators I are highly thermally insulating per se and not only electrically insulating so that the heat flux will not flow via the glass insulators I and only flow through the plate sections between the insulator areas and thus flows via the welds LF to the adjustment frame E. This heat flux can also be influenced by the selection of material and the thickness for both the plate P and the adjustment frame E.

In the embodiment illustrated in FIG. 6, particularly the gripper arm Jus.z for the z dimension is simultaneously exploitable for supplying potential to the component D so that the operating voltage can also be supplied to the component D and the elements like U and V during adjustment and during welding. Thus, the adjustment welding can be executed even under operating conditions while monitoring the optical coupling between the component D and the end N of the optical fiber L. The gripper arm Jus.z for the z dimension as well as the gripper arm Jus.x-y for the x and y dimensions can thus even belong to an automatically controlled micromanipulator which at first automatically, i.e., iteratively searches the optimum adjusted position and then monitors the fastening even when some other fastening method, for example, only gluing, is selected instead of laser welding.

In the invention, however, it is not necessary that the plate P which is at first freely movable in the first dimension z in the adjustment frame E itself be finally secured directly to the adjustment frame E. The holding means may also include a sliding or slidable member GK, which is directly or even indirectly rigidly secured to the plate P so that the plate P is freely movable at first along the z dimension even beyond the optimum adjusted position. When after the adjustment of the sliding member GK with the component D in the optimum adjusted position on the basis of, for example, an iterative movement of the sliding member, the sliding member is then ultimately secured to the adjustment frame E, for example, by means of laser welding similar to that illustrated in FIG. 6. Then the plate P with its component D will be held in the optimum adjusted position.

The embodiment of the inventively constructed module housing comprising a sliding member GK is illustrated in FIGS. 7–11. As illustrated, the component D and the plate P are not directly fastened to the sliding member GK, which is illustrated as being a metal plate but are spaced at a distance to the sliding member GK by means of the pins or bushings Z. An electrical separation of the potential of the sliding member GK from the potential of the component D and from the plate P, as needed, is thereby possible.

Figure 8:
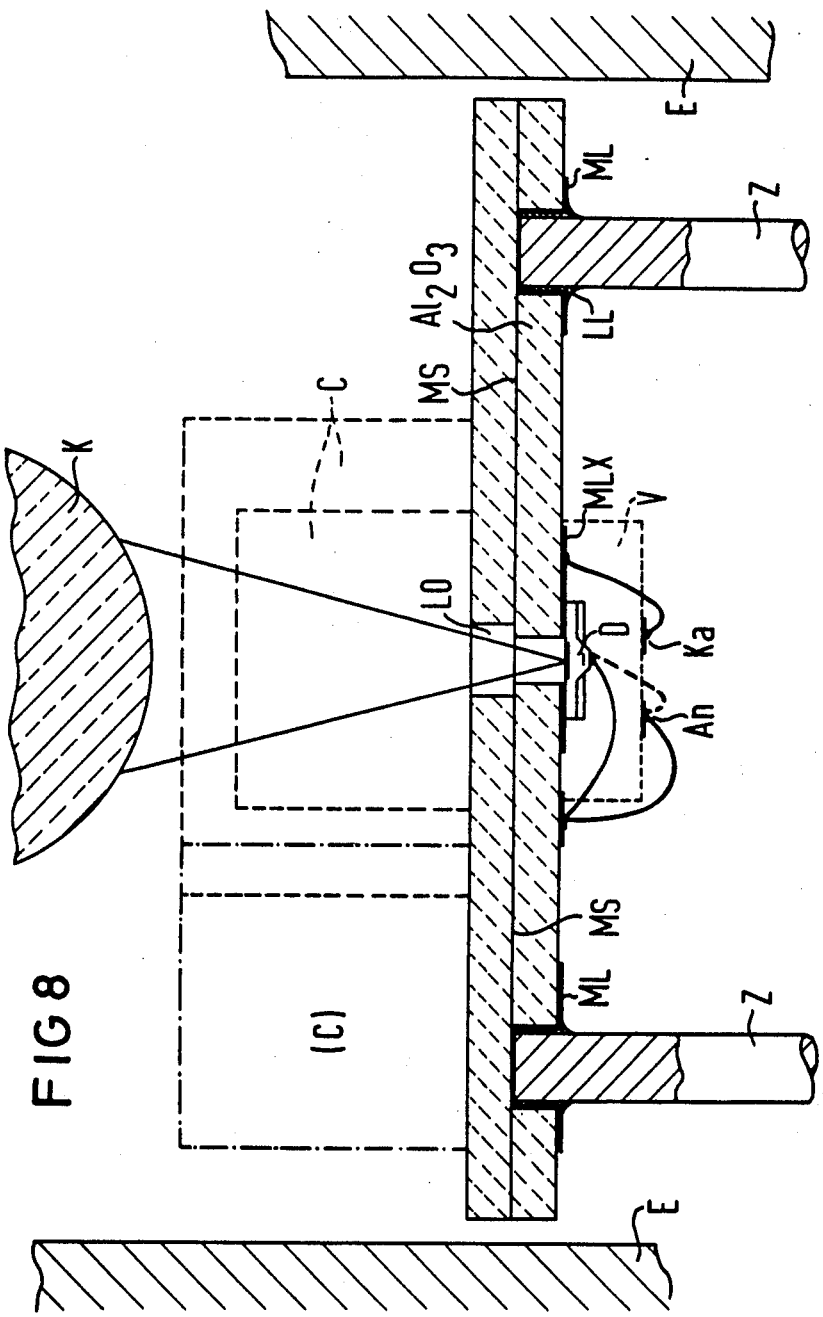
FIG. 8 is an enlarged transverse cross-sectional view of a portion of FIG. 7.

The component D in this case is, for example, a PIN photodiode D with its terminals An/Ka (see FIG. 8). In this embodiment, it is back-illuminated so that, for example, the input capacitance of the adjacent amplifier element V as illustrated in FIGS. 8 and 10, remains minimum.

Figure 10:
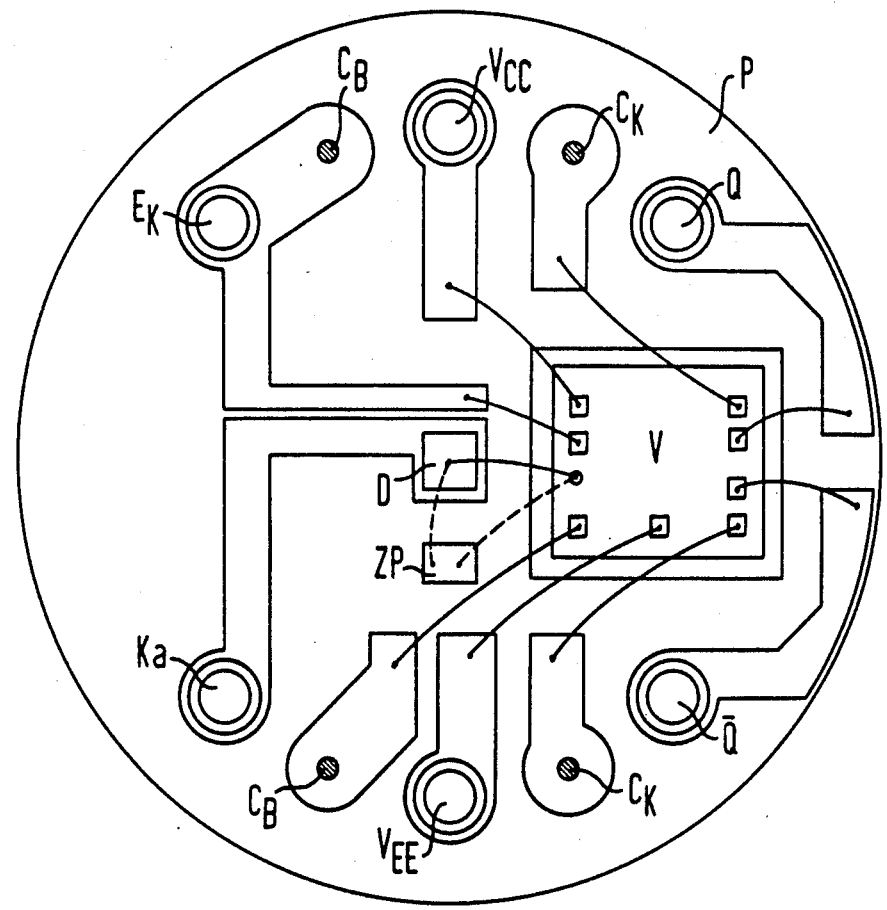
FIG. 10 is a plan view of the plate of FIG. 8 taken from a direction on the side opposite the end of the fiber.

In the embodiment shown in FIG. 10, the component D which is a diode, along with the amplifier can be formed as a single unit as disclosed in German OS No. 34 09 146. As a result of the reduction of the input capacitance of the amplifier V and as a result of the shortness of the lines to the component D, which can be made particularly short in this alternative, the bit rate, measurable in Mbit/seconds, can be made particularly high. It has been beneficial to apply and construct the component D, i.e., for example, the photodiode in this instance such that the input capacitance which acts as the amplifier V is optimally smaller, for example, than about 0.5 pF. A PIN photodiode D itself has a capacitance of, for example, 0.3 pF between its pn-junction and the contact pad when there are no further potential-burdened surfaces at the anode side. Bit rates noticeably above 50 Mbit/seconds for the operation of the component D can be achieved by means of such a dimensioning.

Figure 7:
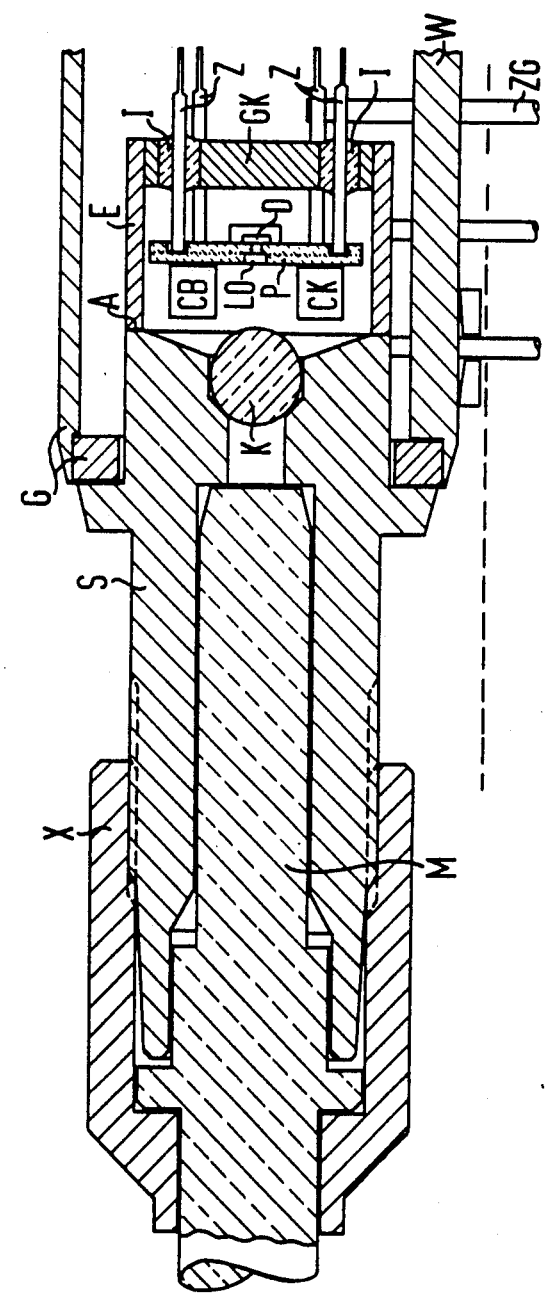
FIG. 7 is a cross-sectional view similar to FIGS. 2 and 3 of another embodiment of the module housing which utilizes a sliding member for positioning the plate relative to the end of the fiber.
Figure 11:
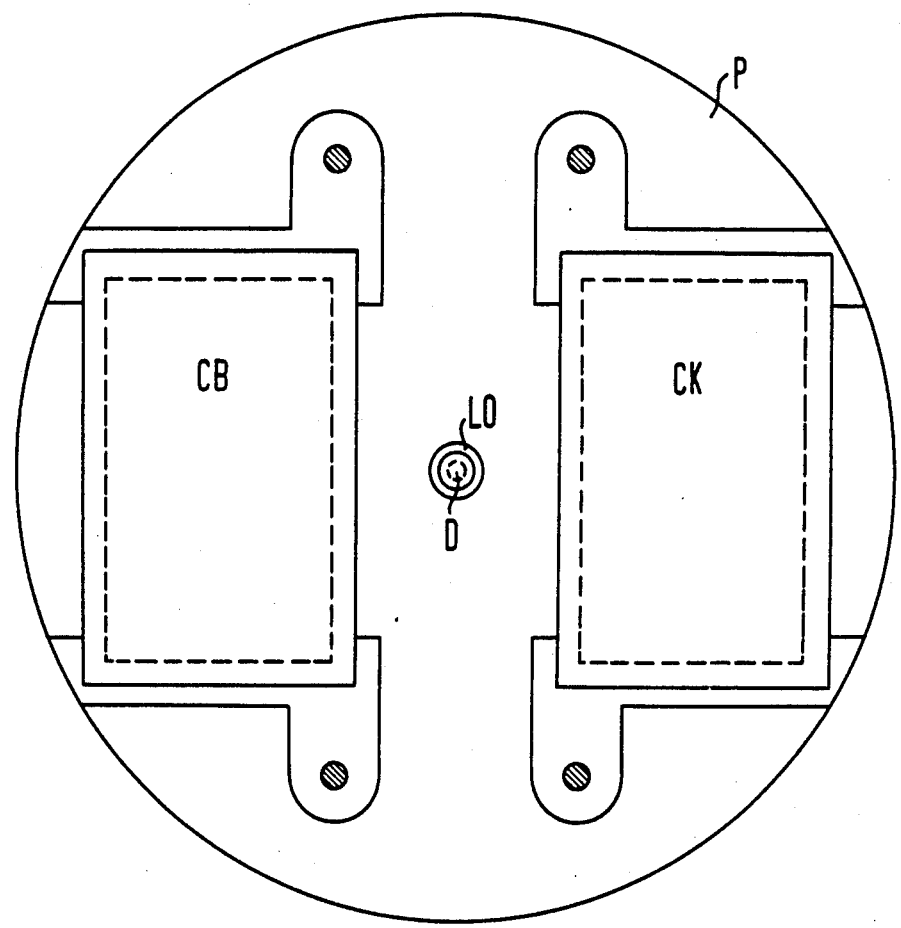
FIG. 11 is a plan view of the plate of FIG. 8 taken on the side facing the end of the fiber.

In this case, the component D is seated and protected on a back surface of the plate P over a stepped bore or opening LO. As illustrated in FIGS. 7, 8 and 11, the bore LO has a stepped configuration to avoid the shadowing effect. However, instead of a stepped bore LO illustrated, a conical bore, for example, can also be utilized here for the same purpose. The plate P with the hole for the radiation cone, for example, can be centered in a continuous process and the comb can then have an angle of approximately 30° given a spherical lens K having a refractive index of 1.5. Other methods can also be applied for producing such bores LO, for example, drilling with laser beams, ultrasonic or diamond drills, however, particular attention should be given to optimally define the cone angle given a selection of a conical bore and to avoid tilted bore axes as well as sharp edges at the transition to the plate surface. In any case, the bore should insofar as possible be fashioned such that it allows the optical coupling between the end N of the optical fiber L and the optically active location of the component D to be optimized in all respects particularly allowing the optimum adjustment position to be established without shadowing.

The plate P can also be fabricated of unsintered, "green" ceramic or of either $Al_2O_3$ or BeO which may be sintered or punched. For example, the plate may be sintered in a continuous process and can further be printed with a thick-film paste and can also be composed of two layers each, for example, 200 μm thick as illustrated in FIG. 8. A sintering in a continuous process just like known applications of pressing techniques, allows respectively defined conical or stepped bores LO to be achieved. For producing such bores, several methods such as pressing, laser beam drilling, ultrasonic drilling or diamond drilling are combinable and are frequently beneficial in view of price. The plate P, however, can also be shaped only by means of pressing techniques which is economical and particularly favorable when there are a high number of items.

Figure 9:
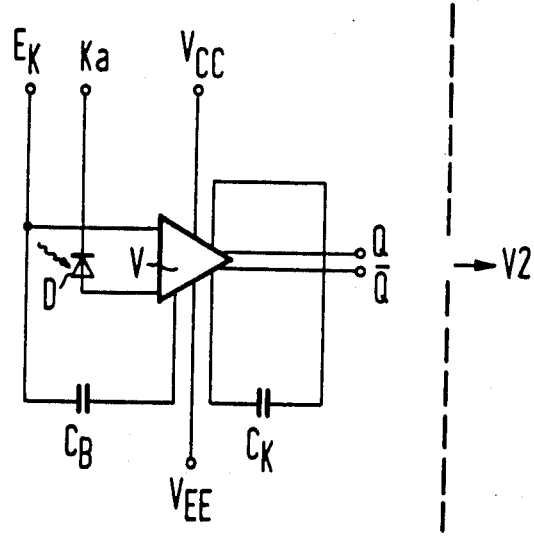
FIG. 9 is a circuit diagram obtained by the arrangement of FIG. 8.

When the plate P, which for example carries a circuit having a preamplifier V with an output $Q/\overline{Q}$ to a booster amplifier V2 outside of a shielding AS (as illustrated in FIG. 9) is made of two insulating layers as illustrated in FIGS. 7 and 8 the plate can also additionally contain an electrical shielding/metal plane MS between the two layers. A plate structure of a metal layer MS sandwiched between two insulating layers can also be used for the plate P of the embodiments of FIGS. 2 and 3. The metal plane MS as needed, can also be fashioned for forwarding potential, i.e., for example, as an electrode of a capacitor. This metal plane or layer MS and the surface-applied metallization MLX can also be advantageously used in order to apply even further elements, for example, even more capacitors, for example, in addition to the two capacitors CK and CB shown in FIGS. 7, 8, 9 and 11 as well as their terminals which are illustrated in FIGS. 9, 10 and 11. Often, namely, there is hardly room for further elements such as capacitors on either of the front side and the back side of the plate P. Given an application of, for example, a metallized surfce of a few mm² in size, for example, MS/MLX at a spacing of, for example, 0.2 mm, namely, capacitances of, for example, 3 pF, can be produced and these are often useful with respect to radio-frequency technology.

Both the front side as well as the back side of the plate P can thus carry electronic elements and conductive structures in addition to the component D. For example, the capacitors are easily possible particularly given the employment of "green ceramic".

On the back side of the plate P moreover, the fastening points for the pins or bushings Z, which are vitrified in the sliding member GK are fashioned as blind holes.

As illustrated in FIGS. 7, 8 and 9, the blind holes are provided with a conducting layer ML which may contact layer MS. A solder or conductive silver adhesive LL is used to improve the mechanical strength. Emplacement of the plate P on the end faces of the pins Z without blind holes, in fact, often yields contacts that are already adequate but often yield mechanical strengths that are too low and that would no longer withstand a test such as vibration tests or mechanical impact tests up to, for example, 1000 g. As a result of the employed blind holes, the end face or upper surface of each of the pins Z may be oriented to extend perpendicular to the pin axis. With such an orientation which is a usable assembly with a sufficiently narrow tolerance, electrical contacting can be executed both at the end faces as well as along the generated surface of the pins Z.

The component D, for example, the PIN photodiode D, after the plate P has been mounted on the pins Z and on the sliding member K is hardly mechanically acceptable anymore and is thus mechanically well-protected when one leaves the bore LO out of consideration. The component D, for example, the PIN photodiode D, however, is electrically accessible via the pins Z, for example, for testing purposes and/or for damage analysis as illustrated by the schematic in FIG. 9. This is often important for example, for "burn-in" of the diode D, for support checks and for qualification determinations so that the test can also be fundamentally executed independently of the function of the amplifier V as needed.

Although various minor modifications may be suggested by those versed in the art, it should be understood that we wish to embody within the scope of the patent granted hereon, all such modifications as reasonably and properly come within the scope of our contribution to the art.

We claim:

1. An opto-electronic module housing for positioning an end of an optical fiber in a desired position relative to an active area of an opto-electronic component, said housing including an optical fiber mounting member having an adjustment plane and means for holding an end of an optical fiber with the axis of the fiber extending perpendicular to said adjustment plane with the end being a fixed distance from the adjustment plane; an adjustmetn frame having a wall portion forming a recess, said frame being movable on said adjustment plane in two of three spatial directions to a selected position and being securable to the adjustment plane in the selected position; and positioning means for locating the opto-electronic component in the recess along a third spatial direction relative to the frame and perpendicular to said plane, said positioning means including a plate having the component mounted thereon, said positioning means being securable to the frame, so that said frame and positioning means enabling adjusting the component in the three spatial directions relative to the end of the fiber to obtain an optimum adjustment position.

2. An opto-electronic module housing according to claim 1, wherein said mounting member at least between said adjustment plane and the end of the optical fiber is composed of at least one member which is stiff and has a low coefficient of thermal expansion so that only slight expansion will occur when heated.

3. An opto-electronic module housing according to claim 1, wherein the third spatial direction largely coincides with the most active direction of the component and the axis of the optical fiber.

4. An opto-electronic module housing according to claim 1, wherein said plate has an aperture extending between a surface facing the end of the fiber and the surface away form the end of the fiber, said component being mounted on the surface facing away from the end of the fiber with the optical-active area positioned over the hole.

5. An opto-electronic module housing according to claim 4, wherein the positioning means includes a slidable member, means for positioning the plate on said slidable member and means for holding the slidable member in the frame, said slidable member being movable relative to the adjustment frame along the third spatial direction parallel to the axis of the fiber even beyond the optimum adjusted position.

6. An opto-electronic module housing according to claim 5, which includes a lens system comprising at least one lens being positioned on the mounting member between the end of the fiber and the component for directing light traveling between the end of the fiber and the component.

7. An opto-electronic module housing according to claim 5, wherein the means for holding the slidable member in the frame and the securing of the frame on the adjustment plane comprises a plurality of laser spot welds.

8. An opto-electronic module housing according to claim 5, which includes at least one amplifier element being connected to the component, said amplifier element being attached adjacent to the component on the surface of the plate which supports the component.

9. An opto-electronic module housing according to claim 5, wherein said plate has means for forming a grounded metallic surface and has insulated contact pins extending through said plate to enable electrically connecting elements mounted on opposite surfaces thereof.

10. An opto-electronic module housing according to claim 1, wherein the plate has the component mounted on a surface facing the end of the fiber.

11. An opto-electronic module housing according to claim 10, which includes a lens system of at least one lens being provided on the mounting member between the component and the end of the fiber to direct light extending between the fiber and the component.

12. An opto-electronic module housing according to claim 10, wherein the securing of the plate in the frame includes laser spot welds between the periphery of the plate and the frame and the securement of the frame on the adjustment plane includes laser spot welds.

13. An opto-electronic module housing according to claim 10, which includes at least one amplifier element being connected to a surface supporting the component adjacent to the component.

14. An opto-electronic module housing according to claim 13, wherein the plate has means forming a grounded metallic surface, conductor means extending through said plate and being insulated therefrom, and at least one additional amplifier component being mounted on a surface facing away from the surface carrying the opto-electronic component, said amplifier component being connected to the opto-electronic component through said connector means.

15. An opto-electronic module housing according to claim 1, which includes an outer housing, said outer housing having an aperture through which the mounting member extends and a lid removably secured in a gas-tight and light-tight fashion to the can to enable access to the interior of the outer housing.

16. An opto-electronic module according to claim 1, wherein said mounting member is an optical fiber connector.

17. In a opto-electronic module housing for positioning an end of an optical fiber in a desired position relative to an active area of an opto-electronic component, said housing including an optical fiber mounting member having an adjustment plane and means for holding an end of the optical fiber with the axis of the fiber extending perpendicular to the adjustment plane with the end being a fixed distance from the adjustment plane, an adjustment frame being securable to the adjustment plane and having a wall portion forming a recess and means for mounting the opto-electronic component inside of the recess of the adjustment frame, the improvement comprising said means for mounting the opto-electronic component being positioning means including a plate, said component being mounted on said plate, said positioning means adjustably positioning the plates in the recess relative to the adjustment frame in a direction extending parallel to the axis of the optical fiber even beyond the optimum adjusted position, said adjustment frame being adjustable in two directions in the adjustment plane extending perpendicular to the optical axis of the fiber even beyond the optimum adjusted position, said positioning means enabling securing of the plate in the recess of the frame and said frame and adjustment plane having means for securing the frame in the adjusted position on the adjustment plane of the mounting member.

* * * * *